(12) United States Patent
Lu et al.

(10) Patent No.: US 11,676,921 B2
(45) Date of Patent: *Jun. 13, 2023

(54) DRIVING CHIP AND DISPLAY PANEL

(71) Applicant: Wuhan China Star Optoelectronics Technology Co., Ltd., Hubei (CN)

(72) Inventors: Yantao Lu, Hubei (CN); Guanghui Liu, Hubei (CN); Chao Wang, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/509,000

(22) Filed: Oct. 24, 2021

(65) Prior Publication Data
US 2022/0045024 A1 Feb. 10, 2022

Related U.S. Application Data

(63) Continuation of application No. 16/612,785, filed as application No. PCT/CN2019/105014 on Sep. 10, 2019, now Pat. No. 11,189,584.

(30) Foreign Application Priority Data

Apr. 11, 2019 (CN) .......................... 201910291274.3

(51) Int. Cl.
| | |
|---|---|
| *G02F 1/13* | (2006.01) |
| *G02F 1/1345* | (2006.01) |
| *H10K 59/131* | (2023.01) |
| *H01L 23/00* | (2006.01) |

(52) U.S. Cl.
CPC .............. *H01L 24/06* (2013.01); *H01L 24/05* (2013.01); *G02F 1/13452* (2013.01); *H01L 2224/05553* (2013.01); *H01L 2224/0603* (2013.01); *H01L 2224/06132* (2013.01); *H10K 59/131* (2023.02)

(58) Field of Classification Search
CPC ........... H01L 24/05–06; H01L 27/3276; H01L 2224/05553; H01L 2224/0603; H01L 2224/06132; G02F 1/13452
USPC .................................. 257/773; 438/618, 666
See application file for complete search history.

(56) References Cited

U.S. PATENT DOCUMENTS

| | | | | |
|---|---|---|---|---|
| 11,189,584 B2 * | 11/2021 | Lu | ........................... | H05K 1/111 |
| 2015/0091163 A1 * | 4/2015 | Kim | ........................ | H01L 24/14 |
| | | | | 257/737 |
| 2018/0102083 A1 * | 4/2018 | So | ......................... | G09G 3/2092 |

FOREIGN PATENT DOCUMENTS

| | | |
|---|---|---|
| CN | 204516283 | 7/2015 |
| CN | 107369692 | 11/2017 |
| CN | 107658234 | 2/2018 |
| CN | 109994042 | 7/2019 |
| KR | 10-2005-0093917 | 9/2005 |

(Continued)

*Primary Examiner* — Didarul A Mazumder

(57) ABSTRACT

A driving chip and a display panel are provided. The display panel includes the driving chip, and a plurality of first bonding pads and a plurality of second bonding pads disposed at two opposite sides out of the driving chip. The driving chip includes a group of first input leads and a group of second input leads. There is an interval between the group of first input leads and the group of second input leads. The group of first input leads is disposed near the first bonding pads, and the group of second input leads is disposed near the second bonding pads.

20 Claims, 6 Drawing Sheets

(56) References Cited

FOREIGN PATENT DOCUMENTS

TW    M573844    2/2019

* cited by examiner

DRIVING CHIP AND DISPLAY PANEL

RELATED APPLICATION

This application is a Continuation of U.S. patent application Ser. No. 16/612,785 filed on Nov. 12, 2019, which is a National Phase of PCT Patent Application No. PCT/CN2019/105014 having International filing date of Sep. 10, 2019, which claims the benefit of priority of Chinese Patent Application No. 201910291274.3 filed on Apr. 11, 2019. The contents of the above applications are all incorporated by reference as if fully set forth herein in their entirety.

FIELD AND BACKGROUND OF THE INVENTION

The present disclosure relates to the field of display technology, and more particularly, to a driving chip and a display panel.

As shown in FIG. 1, in conventional technologies, a driving chip 10 is bonded on a glass substrate of a display panel 100, and a flexible printed circuit board 20 is disposed at two sides of the driving chip 10 so that a narrow frame can be realized in the display panel 100. However, because the flexible printed circuit board 20 is bonded at two sides of the driving chip 10, conducting wires electrically connecting the flexible printed circuit board 20 and the driving chip 10 are too long, causing impedance to be too great so that the display panel may not display normally.

Therefore, it is necessary to provide a technical solution to solve the problem that the display panel cannot display normally due to too great impedance resulting from too long conducting wires.

SUMMARY OF THE INVENTION

A technical problem is that, the present disclosure aims to provide a driving chip and a display panel to reduce impedance of conducting wires connecting bonding pads of the display panel and input leads of the driving chip due to a short distance between the bonding pads and the input leads so that the display panel can display normally.

A display panel, including a display area and a non-display area located at the outside of the display area; wherein a driving chip, and a plurality of first bonding pads and a plurality of second bonding pads disposed at two opposite sides of the driving chip are disposed in the non-display area; and wherein the driving chip includes a plurality of input leads including a group of first input leads and a group of second input leads, wherein the group of first input leads is disposed near the plurality of first bonding pads, wherein the group of second input leads is disposed near the plurality of second bonding pads, and wherein there is an interval between the group of first input leads and the group of second input leads.

In the above display panel, each of the first input leads is electrically connected to each of the plurality of first bonding pads through conducting wires, and each of the second input leads is electrically connected to each of the plurality of second bonding pads through the conducting wires.

In the above display panel, the group of first input leads and the group of second input leads are disposed side by side at the same side of the driving chip.

In the above display panel, the driving chip further includes a plurality of output leads.

In the above display panel, the plurality of output leads, the group of first input leads, and the group of second input leads are disposed side by side, and the plurality of output leads are located between the group of first input leads and the group of second input leads.

In the above display panel, the plurality of output leads are disposed at sides of the group of first input leads and the group of second input leads, opposite to each other.

In the above display panel, the driving chip further includes a plurality of virtual leads.

In the above display panel, the plurality of output leads, the group of first input leads, and the group of second input leads are disposed side by side at a side of the driving chip, away from the display area, the plurality of output leads are located between the group of first input leads and the group of second input leads, and the plurality of virtual leads are located at a side of the driving chip, near the display area.

In the above display panel, the plurality of first bonding pads, near the first input leads, are electrically connected to the first input leads, near the plurality of first bonding pads, through first conducting wires, and the plurality of first bonding pads, away from the first input leads, are electrically connected to the first input leads, away from the plurality of first bonding pads, through second conducting wires.

In the above display panel, the plurality of output leads, the group of first input leads, and the group of second input leads are disposed side by side at a side of the driving chip, near the display area, the plurality of output leads are located between the group of first input leads and the group of second input leads, and the plurality of virtual leads are located at a side of the driving chip, away from the display area.

In the above display panel, the plurality of first bonding pads, near the first input leads, are electrically connected to the first input leads, away from the plurality of first bonding pads, through first conducting wires, and the plurality of first bonding pads, away from the first input leads, are electrically connected to the first input leads, near the plurality of first bonding pads, through second conducting wires.

In the above display panel, the plurality of output leads are located at a side of the driving chip, near the display area, the plurality of virtual leads, the group of first input leads, and the group of second input leads are disposed side by side at a side of the driving chip, away from the display area, and the plurality of virtual leads are located between the group of first input leads and the group of second input leads.

In the above display panel, heights of a part of the plurality of first bonding pads and heights of a part of the plurality of second bonding pads increase gradually from a side near the driving chip to a side away from the driving chip.

In the above display panel, a first bonding pad group is composed of the part of the plurality of first bonding pads, a third bonding pad group is composed of the part of the plurality of second bonding pads, the plurality of first bonding pads of the first bonding pad group are arranged continuously or discontinuously, and the plurality of second bonding pads of the third bonding pad group are arranged continuously or discontinuously.

A driving chip, including a plurality of input leads including a group of first input leads and a group of second input leads, wherein the group of first input leads and the group of second input leads are disposed at an interval.

In the above driving chip, the group of first input leads and the group of second input leads are disposed side by side at the same side of the driving chip.

The above driving chip further includes a plurality of output leads, wherein the plurality of output leads, the group of first input leads, and the group of second input leads are disposed side by side, and wherein the plurality of output leads are located between the group of first input leads and the group of second input leads.

The above driving chip further includes a plurality of output leads, wherein the plurality of output leads are disposed at sides of the first input leads and the second input leads, opposite to each other.

The above driving chip further includes a plurality of virtual leads, wherein the plurality of virtual leads, the group of first input leads, and the group of second input leads are disposed side by side, and wherein the plurality of virtual leads are located between the group of first input leads and the group of second input leads.

The above driving chip further includes a plurality of virtual leads, wherein the plurality of virtual leads are disposed at sides of the first input leads and the second input leads, opposite to each other.

The beneficial effect of the present disclosure is that, the present disclosure provides the driving chip and the display panel. The display panel includes the driving chip, and the plurality of first bonding pads and the plurality of second bonding pads disposed at two opposite sides of the driving chip. The driving chip includes the plurality of input leads including the group of first input leads and the group of second input leads. There is an interval between the group of first input leads and the group of second input leads. In order to reduce the distance between the first input leads and the first bonding pads and the distance between the second input leads and the second bonding pads, the group of first input leads is disposed near the plurality of first bonding pads, and the group of second input leads is disposed near the plurality of second bonding pads, thereby shortening conducting wires, electrically connecting the first input leads and the first bonding pads, and conducting wires, electrically connecting the second input leads and the second bonding pads, and thus reducing impedance of conducting wires so that electrical signals are inputted to the driving chip normally, and thus the display panel displays normally.

Figure 1:
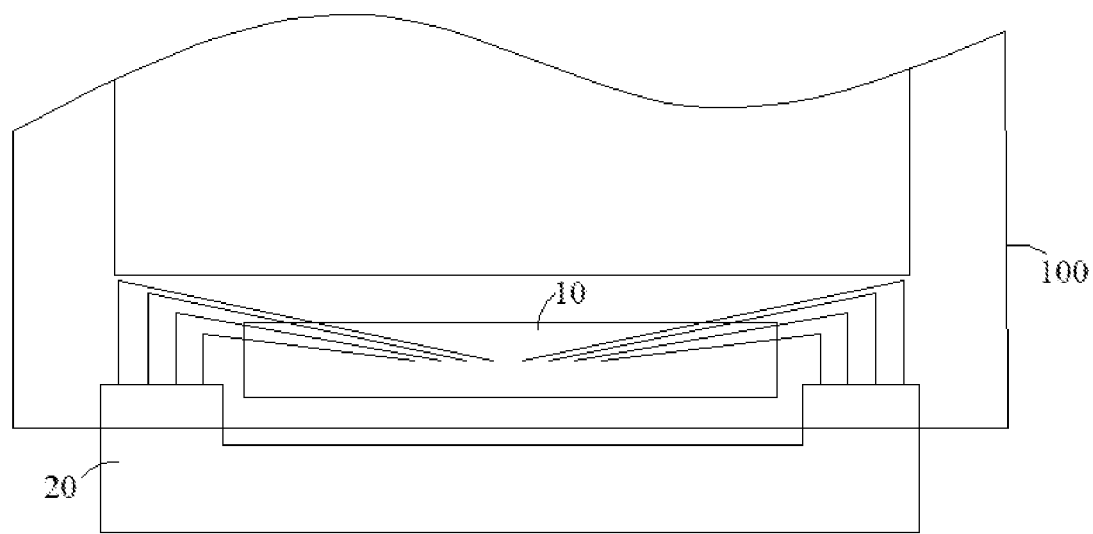
FIG. 1 is a schematic diagram of a driving chip and a flexible printed circuit board, bonded on a display panel in conventional technologies.

Notations in the accompanying drawings are as follows:

A display panel 100, a display area 100a, a non-display area 100b, driving chips 10 and 11, a group of first input leads 111, a group of second input leads 112, first input leads 1111, second input leads 1121, output leads 113, virtual leads 114, first bonding pads 141, second bonding pads 142, a first bonding pad group 141a, a second bonding pad group 141b, a third bonding pad group 142a, a fourth bonding pad group 142b, a first child bonding pad 1411, a second child bonding pad 1412, a third child bonding pad 1413, a fourth child bonding pad 1414, a fifth child bonding pad 1415, a sixth child bonding pad 1416, first conducting wires 161, second conducting wires 162, fan-out traces 18, and a flexible printed circuit board 20.

DESCRIPTION OF SPECIFIC EMBODIMENTS OF THE INVENTION

For the embodiments of the present disclosure, their technical solutions will be described clearly and completely in conjunction with their accompanying drawings below. It is obvious that the embodiments described herein are merely a part of the embodiments of the present disclosure instead of all of the embodiments. A person having ordinary skill in this field can obtain other embodiments according to the embodiments of the present disclosure under the premise of not paying creative works, and all of these embodiments should be within the protective scope of the present disclosure.

Figure 2:
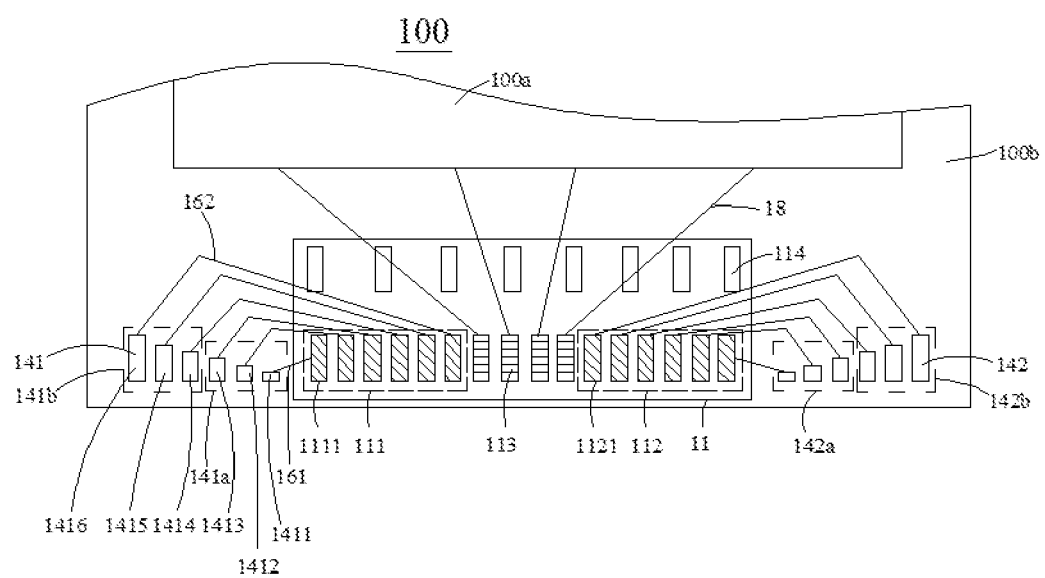
FIG. 2 is a schematic structural diagram of a display panel according to a first embodiment of the present disclosure.

Please refer to FIG. 2, which is a schematic structural diagram of a display panel according to a first embodiment of the present disclosure. The display panel 100 is a liquid crystal display panel or an organic light-emitting diode display panel. The display panel 100 includes a display area 100a and a non-display area 100b located at the outside of the display area 100a. A driving chip 11, a plurality of first bonding pads 141, and a plurality of second bonding pads 142 are disposed in the non-display area 100b.

The driving chip 11 is located at the middle of a side of the non-display area 100b of the display panel 100. The driving chip 11 includes a plurality of input leads, a plurality of output leads 113, and a plurality of virtual leads 114. The plurality of input leads include a group of first input leads 111 and a group of second input leads 112.

The group of first input leads 111 and the group of second input leads 112 are both used to input electrical signals to the driving chip 11. The group of first input leads 111 includes a plurality of first input leads 1111, and the group of second input leads 112 includes a plurality of second input leads 1121. There is an interval between the group of first input leads 111 and the group of second input leads 112. The group of first input leads 111 is disposed near the plurality of first bonding pads 141, and the group of second input leads 112 is disposed near the plurality of second bonding pads 142. That is, the first input leads 1111 are disposed to gather at a side of the driving chip 11, near the plurality of first bonding pads 141, and the second input leads 1121 are disposed to gather at a side of the driving chip 11, near the plurality of second bonding pads 142. The group of first input leads 111 and the group of second input leads 112 are disposed at an interval and at two ends of the driving chip 11, so that the distances between the plurality of first bonding pads 141 and the first input leads 1111 of the group of first input leads 111 become short, and the distances between the plurality of second bonding pads 142 and the second input leads 1121 of the group of second input leads 112 become short. Compared with conventional technologies, in the present disclosure, the distances between the first bonding pads 141 and the group of first input leads 111 become shorter, and the distances between the second bonding pads 142 and the group of second input leads 112 become shorter, thereby shortening conducting wires, connecting the first input leads 1111 and the first bonding pads 141, and conducting wires, connecting the second input leads 1121 and the second bonding pads 142, and thus reducing impedance of conducting wires so that electrical signals are sure to be inputted to the driving chip 11 normally, and thus the display panel displays normally. Specifically, in the present disclosure, the lengths of conducting wires, connecting the driving chip 11 and bonding pads 142 away from the driving chip 11, are reduced through disposing the group of first input leads 111 near a side of the first bonding pads 141 and through disposing the group of second input leads 112 near a side of the second bonding pads 142, thereby reducing impedance of conducting wires so that the display panel displays images normally.

The group of first input leads 111 and the group of second input leads 112 are disposed side by side at the same side of the driving chip 11. The plurality of output leads 113, the group of first input leads 111, and the group of second input leads 112 are disposed side by side, and the plurality of output leads 113 are located between the group of first input leads 111 and the group of second input leads 112. Specifically, the plurality of output leads 113, the group of first input leads 111, and the group of second input leads 112 are disposed side by side at a side of the driving chip 11, away from the display area 100a, and the plurality of output leads 113 are located between the group of first input leads 111 and the group of second input leads 112. The plurality of output leads 113 are also located in the middle of the driving chip 11, away from the display area 100a. The first input leads 1111 are disposed side by side at an equal interval, the second input leads 1121 are disposed side by side at an equal interval, and the output leads 113 are disposed side by side at an equal interval. It can be understood that the group of first input leads 111 can also intersect with the group of second input leads 112, as long as the distances between the first input leads 1111 and the first bonding pads 141 become short and the distances between the second input leads 1121 and the second bonding pads 142 become short.

It needs to be explained that, in order that the output leads 113, the first input leads 111, and the second input leads 112 are disposed side by side, and the output leads 113 are disposed between the group of first input leads 111 and the group of second input leads 112, the size of the driving chip in the present disclosure has no change relative to conventional driving chips. Relative to conventional technologies, conventional input leads are filtered in the present disclosure, that is, discarding input leads which have no influence on the driving chip after the input leads being discarded, such as discarding input leads which having the same functions in order to reduce the number of input leads, then dividing the rest of the input leads into the group of first input leads 111 and the group of second input leads 112, and then disposing the output leads 113 between the group of first input leads 111 and the group of second input leads 112. In the present disclosure, when the group of first input leads 111 and the group of second input leads 112 are disposed side by side, leads including virtual leads or all of the output leads in conventional technologies can be disposed between the group of first input leads 111 and the group of second input leads 112.

The virtual leads 114 are used to cause the driving chip 11 to be bonded smoothly on the display panel 100. The virtual leads 114 are located at a side of the driving chip 11, near the display area 100a. Specifically, as shown in FIG. 2, the virtual leads 114 are aligned side by side at the side of the driving chip 11, near the display area 100a. The virtual leads 114 are not connected to electrical signals. The virtual leads 114 whose thicknesses perpendicular to a thickness direction of the driving chip 11 are equal to thicknesses of the first input leads 1111, the second input leads 1121, and the output leads 113, perpendicular to the thickness direction of the driving chip 11. The thicknesses of the first input leads 1111, the second input leads 1121, and the output leads 113, perpendicular to the thickness direction of the driving chip 11, are identical so that the driving chip 11 can be bonded smoothly on a glass substrate of the display panel 100.

The first bonding pads 141 and the second bonding pads 142 are disposed at two opposite sides of the driving chip 11 respectively. The first bonding pads 141 are located at a side, where the driving chip 11 is, and adjacent to a side of the display area 100a, where the driving chip 11 is. Each of the first input leads 1111 is connected to each of the first bonding pads 141 through conducting wires, and each of the second input leads 1121 is connected to each of the second bonding pads 142 through the conducting wires. Heights of a part of the first bonding pads 141 and heights of a part of the second bonding pads 142 increase gradually from a side near the driving chip 11 to a side away from the driving chip 11 in order to solve the problem of abnormal display caused by short circuits, resulting from too crowded conducting wires near a side of the driving chip due to a smaller space near the driving chip when heights of the bonding pads in conventional technologies are identical.

As shown in FIG. 2, a first bonding pad group 141a is composed of a part of the first bonding pads 141. The first bonding pads 141 further include a second bonding pad group 141b besides the first bonding pad group 141a. A third bonding pad group 142a is composed of a part of the second bonding pads 142. The second bonding pads 142 further include a fourth bonding pad group 142b besides the third bonding pad group 142a. The first bonding pads 141 of the first bonding pad group 141a are arranged continuously or discontinuously, and the second bonding pads 142 of the third bonding pad group 142a are arranged continuously or discontinuously. The heights of the first bonding pads 141 of the first bonding pad group 141a, which are arranged continuously, increase sequentially from the side near the driving chip 11 to the side away from the driving chip 11. The heights of the second bonding pads 142 of the third bonding pad group 142a, which are arranged continuously, increase sequentially from the side near the driving chip 11 to the side away from the driving chip 11. The third bonding pad group 142a is disposed near a side of the driving chip 11, and the fourth bonding pad group 142b is disposed away from the side of the driving chip 11.

In order to expand the technical solution that the heights of the part of the first bonding pads 141 increase gradually from the side near the driving chip 11 to the side away from the driving chip 11, for instance, the number of the first bonding pads 141 can be, but not limited to, six. The first bonding pads 141 include a first child bonding pad 1411, a second child bonding pad 1412, a third child bonding pad 1413, a fourth child bonding pad 1414, a fifth child bonding pad 1415, and a sixth child bonding pad 1416, sequentially arranged from the side near the driving chip 11 to the side away from the driving chip 11.

Figure 3A:
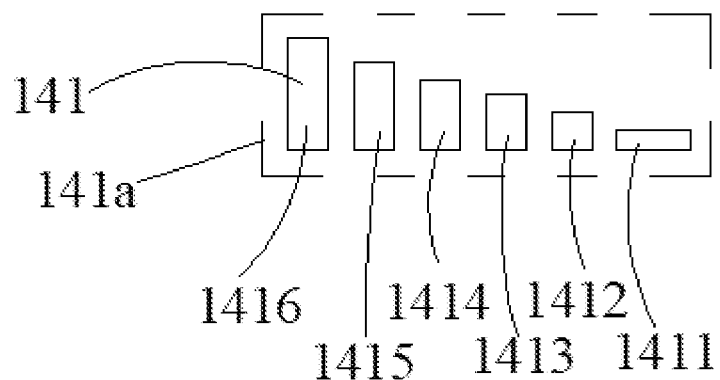
FIG. 3A is a first schematic diagram of first bonding pads in the display panel shown in FIG. 2.

As shown in FIG. 3A, which is a first schematic diagram of first bonding pads in the display panel shown in FIG. 2. All of the first bonding pads 141 are included in the first bonding pad group 141a. Heights of the first bonding pads 141 sequentially gradually increase from the side near the driving chip 11 to the side away from the driving chip 11 in order to enlarge the space, at the top of the first bonding pads 141 near the driving chip 11 and configured for arranging the conducting wires, and avoid abnormal display caused by short circuits occurring in the conducting wires, connecting the first input leads 1111 and the first bonding pads 141.

Figure 3B:
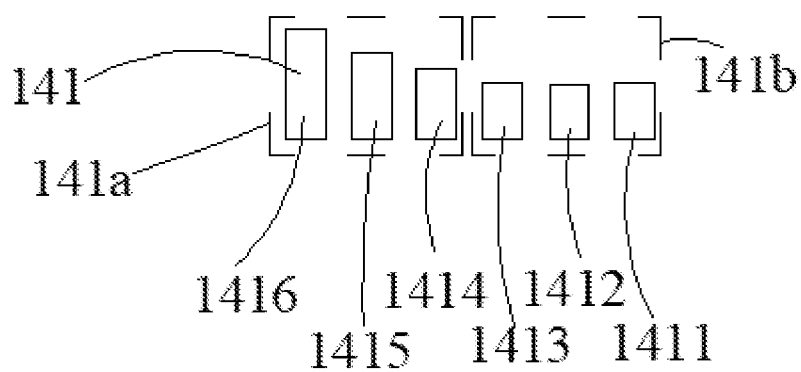
FIG. 3B is a second schematic diagram of the first bonding pads in the display panel shown in FIG. 2.

As shown in FIG. 3B, which is a second schematic diagram of the first bonding pads in the display panel shown in FIG. 2. The first bonding pads 141 are included in the first bonding pad group 141a and the second bonding pad group 141b. The second bonding pad group 141b is located between the first bonding pad group 141a and the driving chip 11. The first bonding pad group 141a includes the fourth child bonding pad 1414, the fifth child bonding pad 1415, and the sixth child bonding pad 1416. The second bonding pad group 141b includes the first child bonding pad 1411, the second child bonding pad 1412, and the third child bonding pad 1413. In the first bonding pad group 141a, the height of the fourth child bonding pad 1414 is less than the height of the fifth child bonding pad 1415, and the height of the fifth child bonding pad 1415 is less than the height of the sixth child bonding pad 1416. In order to increase a layout space of conducting wires, heights of the first child bonding pad 1411, the second child bonding pad 1412, and the third child bonding pad 1413 are less than or equal to the height of the fourth child bonding pad 1414. In other embodiments with the first bonding pads, the heights of the first child bonding pad 1411, the second child bonding pad 1412, and the third child bonding pad 1413 can also be greater than the height of the fourth child bonding pad 1414.

Figure 3C:
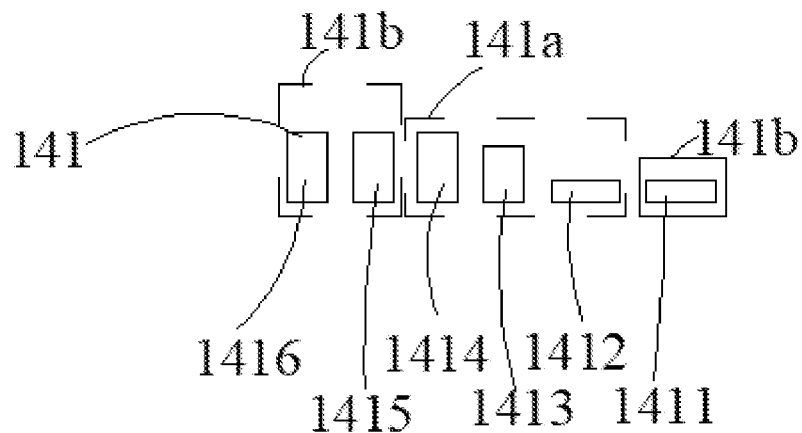
FIG. 3C is a third schematic diagram of the first bonding pads in the display panel shown in FIG. 2.

As shown in FIG. 3C, which is a third schematic diagram of the first bonding pads in the display panel shown in FIG. 2. The first bonding pads 141 are included in the first bonding pad group 141a and the second bonding pad groups 141b. The second bonding pad groups 141b is located at two sides of the first bonding pad group 141a. The first bonding pad group 141a includes the second child bonding pad 1412, the third child bonding pad 1413, and the fourth child bonding pad 1414. The second bonding pad groups 141b includes the first child bonding pad 1411, the fifth child bonding pad 1415, and the sixth child bonding pad 1416. In the first bonding pad group 141a, the height of the second child bonding pad 1412 is less than the height of the third child bonding pad 1413, and the height of the third child bonding pad 1413 is less than the height of the fourth child bonding pad 1414. In order to increase the layout space of conducting wires, the height of the first child bonding pad 1411 can be less than or equal to the height of the second child bonding pad 1412, and heights of the fifth child bonding pad 1415 and the sixth child bonding pad 1416 can be greater than or equal to the height of the fourth child bonding pad 1414. It can be understood that the heights of the fifth child bonding pad 1415 and the sixth child bonding pad 1416 can also be less than the height of the fourth child bonding pad 1414.

Figure 3D:
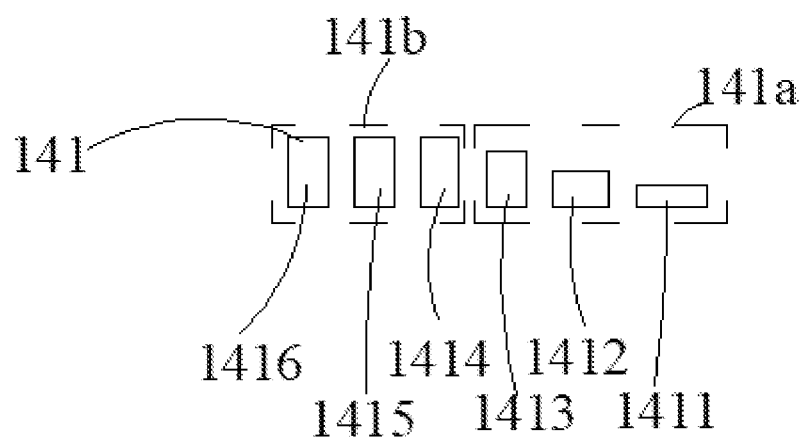
FIG. 3D is a fourth schematic diagram of the first bonding pads in the display panel shown in FIG. 2.

As shown in FIG. 3D, which is a fourth schematic diagram of the first bonding pads in the display panel shown in FIG. 2. The first bonding pads 141 are included in the first bonding pad group 141a and the second bonding pad group 141b. The first bonding pad group 141a is located between the second bonding pad group 141b and the driving chip 11. The first bonding pad group 141a includes the first child bonding pad 1411, the second child bonding pad 1412, and the third child bonding pad 1413. The second bonding pad group 141b includes the fourth child bonding pad 1414, the fifth child bonding pad 1415, and the sixth child bonding pad 1416. The height of the first child bonding pad 1411 is less than the height of the second child bonding pad 1412, and the height of the second child bonding pad 1412 is less than the height of the third child bonding pad 1413. Heights of the fourth child bonding pad 1414, the fifth child bonding pad 1415, and the sixth child bonding pad 1416 can be greater than or equal to or less than the height of the third child bonding pad 1413.

Figure 3E:
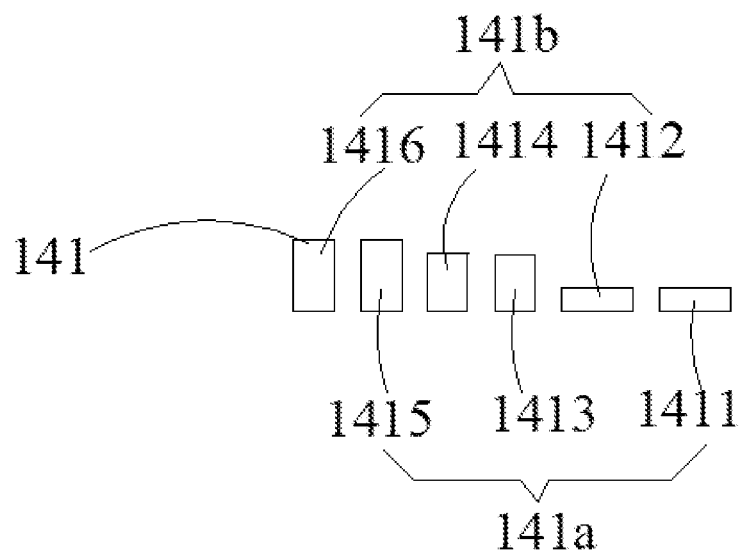
FIG. 3E is a fifth schematic diagram of the first bonding pads in the display panel shown in FIG. 2.

As shown in FIG. 3E, which is a fifth schematic diagram of the first bonding pads in the display panel shown in FIG. 2. The first bonding pads 141 are included in the first bonding pad group 141a and the second bonding pad group 141b. The first bonding pad group 141a can include any two of the first bonding pads 141, arranged at an interval. Specifically, the first bonding pad group 141a includes the first child bonding pad 1411, the third child bonding pad 1413, and the fifth child bonding pad 1415. The second bonding pad group 141b includes the second child bonding pad 1412, the fourth child bonding pad 1414, and the sixth child bonding pad 1416. The height of the first child bonding pad 1411 is less than the height of the third child bonding pad 1413, and the height of the third child bonding pad 1413 is less than the height of the fifth child bonding pad 1415. The height of the second child bonding pad 1412 can be between heights of the first child bonding pad 1411 and the third child bonding pad 1413 or equal to the height of any one of the first child bonding pad 1411 and the third child bonding pad 1413. The height of the fourth child bonding pad 1414 can be between heights of the third child bonding pad 1413 and the fifth child bonding pad 1415 or equal to the height of any one of the third child bonding pad 1413 and the fifth child bonding pad 1415. The height of the sixth child bonding pad 1416 can be greater than or equal to or less than the height of the fifth child bonding pad 1415. In other schematic diagrams with the first bonding pads, the number of the first bonding pads 141, in the second bonding pad group 141b and between the first child bonding pad 1411 and the third child bonding pad 1413, can be, but not limited to, one or more than one. The number of the first bonding pads 141, in the second bonding pad group 141b and between the third child bonding pad 1413 and the fifth child bonding pad 1415, can be, but not limited to, one or more than one.

The arrangement method of the second bonding pads 142 is the same as that of the first bonding pads 141 and is therefore not described in detail here.

Specifically, heights of a part of the first bonding pads 141 sequentially gradually increase from the side near the driving chip 11 to the side away from the driving chip 11. Heights of a part of the second bonding pads 142 sequentially gradually increase from the side near the driving chip 11 to the side away from the driving chip 11. Thus, abnormal display caused by short circuits occurring in the conducting wires, connecting the first input leads 1111 and the first bonding pads 141 and connecting the second input leads 1121 and the second bonding pads 142, is avoided further.

The first bonding pads 141 are disposed side by side at an equal interval, and the areas of any two of the first bonding pads 141 are identical. The second bonding pads 142 are disposed side by side at an equal interval, and the areas of any two of the second bonding pads 142 are identical. The first bonding pads 141 and the second bonding pads 142 have shapes of regular figures or irregular figures. The regular figures include a rectangle, a trapezoid, and so on.

Further, the difference in height between any two adjacent first bonding pads 141 is identical, and the difference in height between any two adjacent second bonding pads 142 is identical.

The first bonding pads 141 (such as the first child bonding pad 1411), near the first input leads 1111, are electrically connected to the first input leads 1111, near the first bonding pads 141, through first conducting wires 161. The first bonding pads 141 (such as the sixth child bonding pad 1416), away from the first input leads 1111, are electrically connected to the first input leads 1111, away from the first bonding pads 141, through second conducting wires 162. The lengths of the first conducting wires 161 are less than those of the second conducting wires 162. Because the first conducting wires 161 have short lengths and small impedance, the first bonding pads 141, near the first input leads 1111, are used to input electrical signals demanding small resistance of conducting wire to the first input leads 1111, near the first bonding pads 141, and the first bonding pads 141, away from the first input leads 1111, are used to input electrical signals without demanding small resistance of conducting wire to the first input leads 1111, away from the first bonding pads 141.

It needs to be stated that the upper space of the driving chip 11 (i.e., the side space of the driving chip 11 where the virtual leads 114 in FIG. 2 are located) can be used to arrange fan-out traces 18 extending from the display area 100a to the driving chip 11, that is, a part of space occupied by the fan-out traces 18 and space occupied by the driving chip 11 overlap, thereby reducing an interval between the display area 100a and the driving chip 11 and narrowing a bottom frame of the display panel 100 in the embodiments of the present disclosure.

Figure 4:
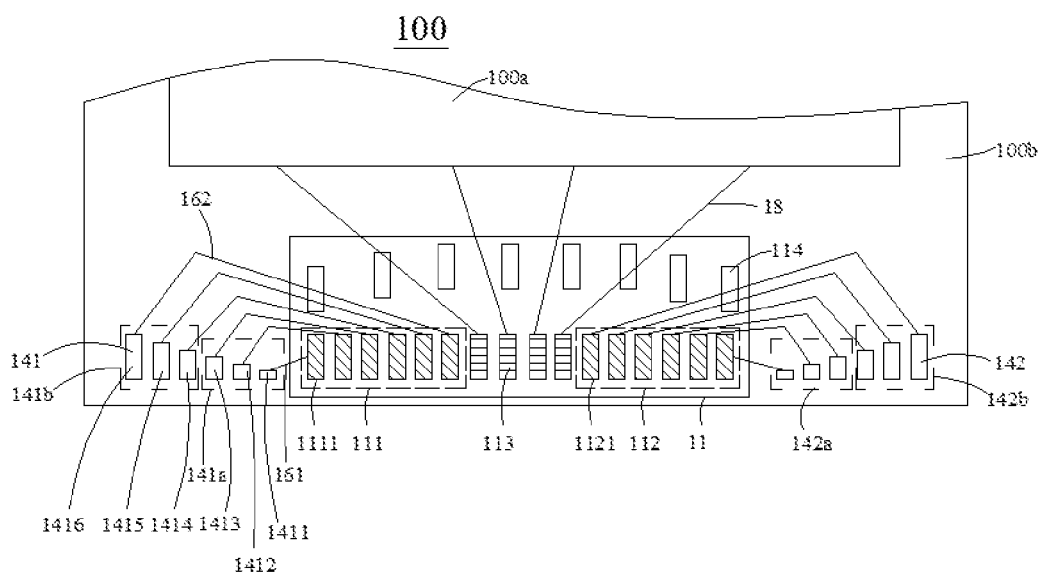
FIG. 4 is a schematic structural diagram of a display panel according to a second embodiment of the present disclosure.

Please refer to FIG. 4, which is a schematic structural diagram of a display panel according to a second embodiment of the present disclosure. The display panel 100 shown in FIG. 4 is basically similar to the display panel shown in FIG. 2, and their difference is that the virtual leads 114 are distributed as an arc line. It can be understood that the virtual leads 114 can also be distributed as other shapes, as long as it is ensured that the driving chip 11 can be bonded smoothly on the display panel 100.

Figure 5:
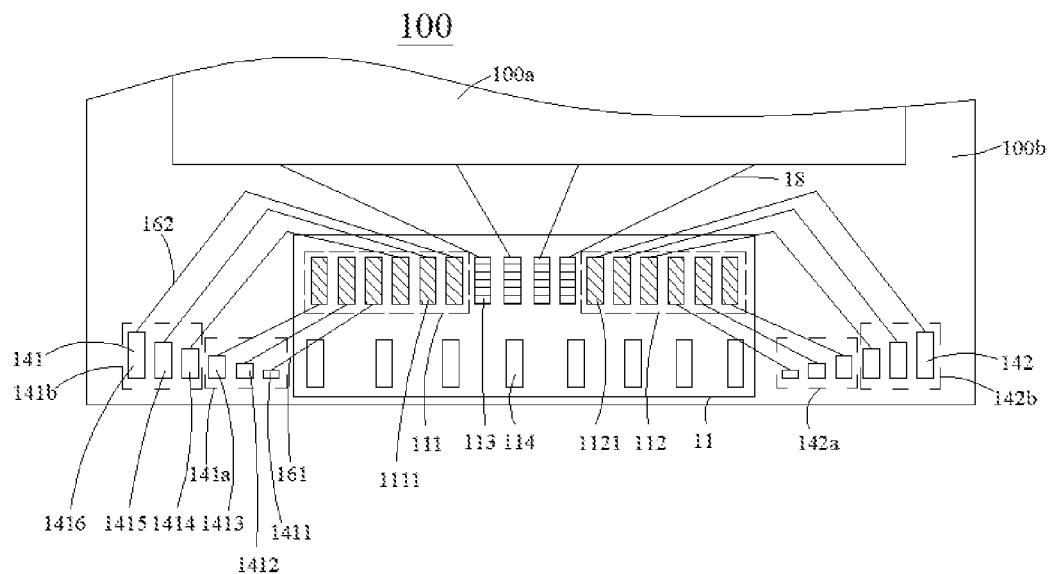
FIG. 5 is a schematic structural diagram of a display panel according to a third embodiment of the present disclosure.

Please refer to FIG. 5, which is a schematic structural diagram of a display panel according to a third embodiment of the present disclosure. The display panel 100 shown in FIG. 5 is basically similar to the display panel 100 shown in FIG. 2, and their difference is that the output leads 113, the group of first input leads 111, and the group of second input leads 112 are disposed side by side at a side of the driving chip 11, near the display area 100a, the output leads 113 are located between the group of first input leads 111 and the group of second input leads 112, and the virtual leads 114 are located at a side of the driving chip 11, away from the display area 100a.

The first bonding pads 141 (such as the first child bonding pad 1411), near the first input leads 1111, are electrically connected to the first input leads 1111, near the first bonding pads 141, through the first conducting wires 161. One end of the first conducting wire 161 is connected to one end of the first input lead 1111 near the first bonding pads 141, away from the display area 100a. The first bonding pads 141 (such as the sixth child bonding pad 1416), away from the first input leads 1111, are electrically connected to the first input leads 1111, away from the first bonding pads 141, through the second conducting wires 162. One end of the second conducting wires 162 is connected to one end of the first input lead 1111 away from the first bonding pads 141, near the display area 100a. The lengths of the first conducting wires 161 are less than those of the second conducting wires 162.

Figure 6:
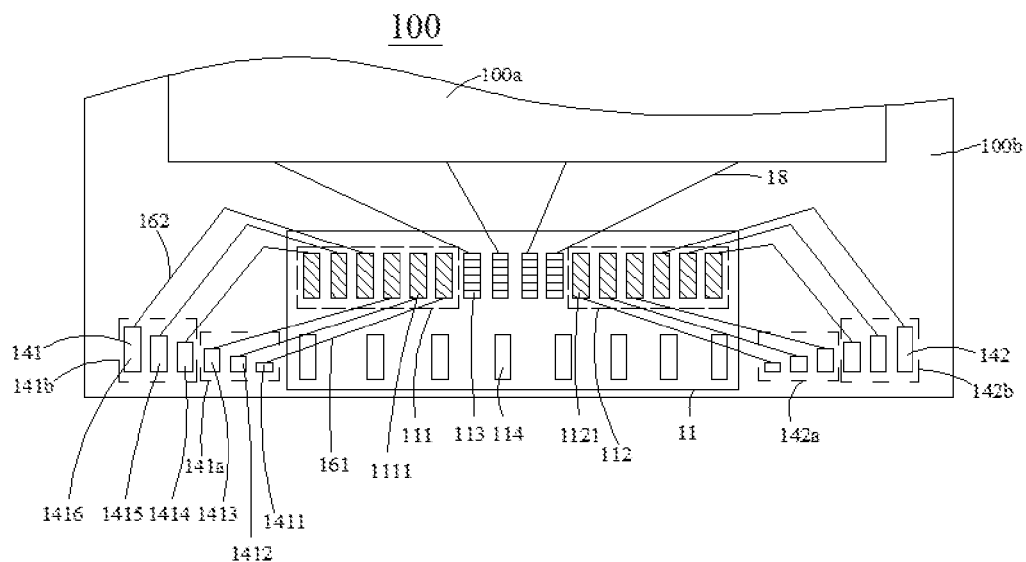
FIG. 6 is a schematic structural diagram of a display panel according to a fourth embodiment of the present disclosure.

As shown in FIG. 6, which is a schematic structural diagram of a display panel according to a fourth embodiment of the present disclosure. The display panel shown in FIG. 6 is basically similar to the display panel shown in FIG. 5, and their difference is that, the first bonding pads 141 (such as the first child bonding pad 1411), near the first input leads 1111, are electrically connected to the first input leads 1111, away from the first bonding pads 141, through the first conducting wires 161, and the first bonding pads 141 (such as the sixth child bonding pad 1416), away from the first input leads 1111, are electrically connected to the first input leads 1111, near the first bonding pads 141, through the second conducting wires 162. Therefore, the lengths of the first conducting wires 161 and the second conducting wires 162 tend to be identical, thereby causing impedance of the first conducting wires 161 and the second conducting wires 162 to be more synchronized.

It needs to be stated that in the display panel shown in FIG. 5 and FIG. 6, a part of conducting wires (such as the first conducting wires 161) connecting the first input leads 1111 and the first bonding pads 141 are connected to ends of the first input leads 1111, away from the display area 100a, and a part of conducting wires (such as the second conducting wires 162) connecting the first input leads 1111 and the first bonding pads 141 are connected to ends of the first input leads 1111, near the display area 100a. A sufficient layout space at the side of the driving chip 11, away from the display area 100a (i.e., a side of the driving chip 11 where the virtual leads 114 are disposed) coordinates that the heights of a part of the first bonding pads 141 gradually increase from the side near the driving chip 11 to the side away from the driving chip 11, causing short circuits not to occur due to a more sufficient layout space at the side of the driving chip 11, away from the display area 100a (i.e., the side of the driving chip 11 where the virtual leads 114 are disposed), for the conducting wires (such as the first conducting wires 161) connecting the first input leads 1111 and the first bonding pads 141 near the driving chip 11. Moreover, the part of conducting wires (such as the second conducting wires 162) connecting the first input leads 1111 and the first bonding pads 141 are connected to the ends of the first input leads 1111, near the display area 100a, causing the conducting wires not to gather in an area so that short circuits are prevented from occurring between the conducting wires further. For the same reason, short circuits are also prevented from occurring between the conducting wires connecting the second input leads 1121 and the second bonding pads 142. In addition, space occupied by a part of the conducting wires connecting the second input leads 1121 and the second bonding pads 142, space occupied by a part of the conducting wires connecting the first input leads 1111 and the first bonding pads 141, and space for bonding the driving chip 11 overlap, thereby reducing the whole space occupied by the conducting wires besides the space occupied by the driving chip 11.

Figure 7:
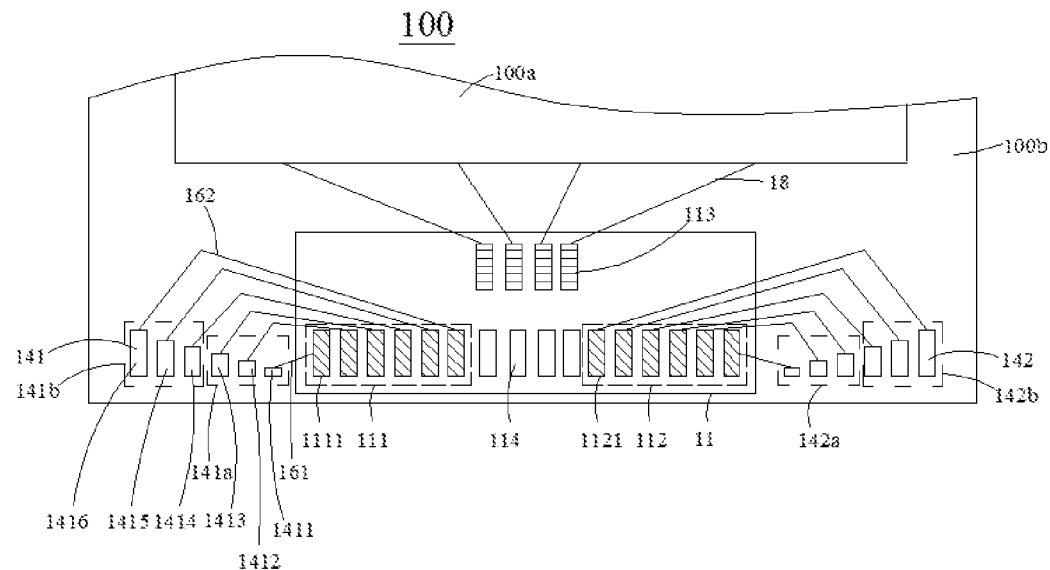
FIG. 7 is a schematic structural diagram of a display panel according to a fifth embodiment of the present disclosure.

Please refer to FIG. 7, which is a schematic structural diagram of a display panel according to a fifth embodiment of the present disclosure. The display panel 100 shown in FIG. 7 is basically similar to the display panel 100 shown in FIG. 2, and their difference is that, the output leads 113 are located in the middle of the driving chip 11, near the display area 100a, and disposed at sides of the group of first input leads 111 and the group of second input leads 112, opposite to each other. Furthermore, the virtual leads 114, the group of first input leads 111, and the group of second input leads 112 are disposed side by side at the side of the driving chip 11, away from the display area 100a, and the virtual leads 114 are located between the group of first input leads 111 and the group of second input leads 112.

Figure 8:
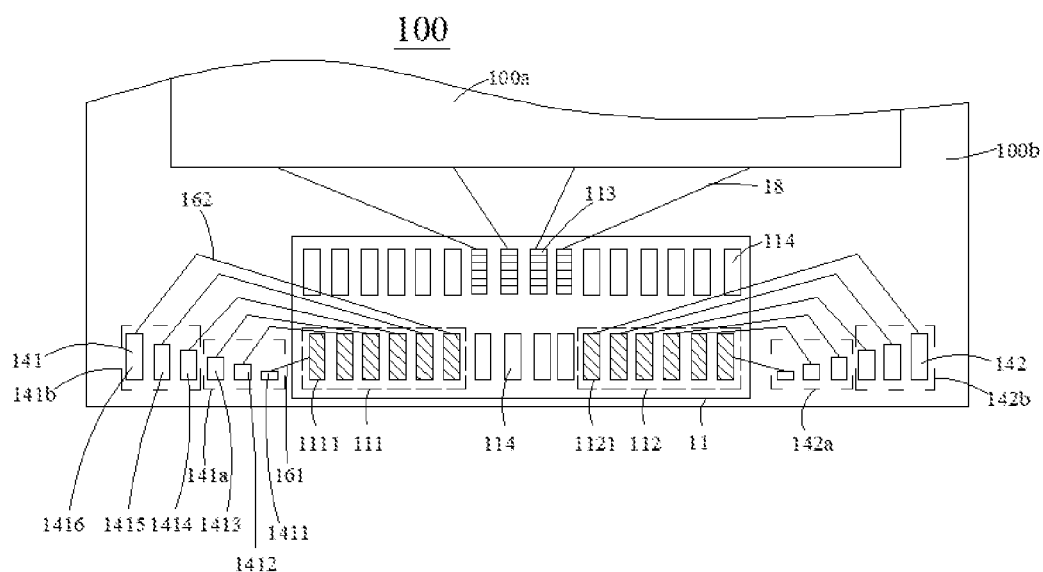
FIG. 8 is a schematic structural diagram of a display panel according to a sixth embodiment of the present disclosure.

Please refer to FIG. 8, which is a schematic structural diagram of a display panel according to a sixth embodiment of the present disclosure. The display panel 100 shown in FIG. 8 is basically similar to the display panel 100 shown in FIG. 7, and their difference is that, a part of the virtual leads 114, the group of first input leads 111, and the group of second input leads 112 are disposed side by side at the side of the driving chip 11, away from the display area 100a, and the part of the virtual leads 114 are located between the group of first input leads 111 and the group of second input leads 112; and a part of the virtual leads 114 and the output leads 113 are disposed side by side at the side of the driving chip 11, near the display area 100a, and the part of the virtual leads 114 are located at two sides of the output leads 113. Relative to the driving chip shown in FIG. 7, the driving chip shown in FIG. 8 can be bonded more smoothly on the display panel.

The present disclosure further provides a driving chip. The driving chip includes a plurality of input leads including a group of first input leads and a group of second input leads. The group of first input leads and the group of second input leads are disposed at an interval. When the driving chip is bonded on the display panel, the group of first input leads and the group of second input leads are disposed near their corresponding bonding pads respectively, causing the distances between the first input leads and corresponding bonding pads and between the second input leads and corresponding bonding pads to become short, and thus shortening conducting wires, connecting the first input leads and the corresponding bonding pads, and conducting wires, connecting the second input leads and the corresponding bonding pads, so that impedance of conducting wires becomes small, electrical signals inputted to the driving chip through the conducting wires are normal, and thus the display panel displays normally.

Please refer to FIGS. 2, 4, 5, and 6, the group of first input leads 111 and the group of second input leads 112 are disposed side by side at the same side of the driving chip 11. The driving chip 11 further includes a plurality of output leads 113. The output leads 113, the group of first input leads 111, and the group of second input leads 112 are disposed side by side. The output leads 113 are located between the group of first input leads 111 and the group of second input leads 112.

Please refer to FIG. 7 and FIG. 8, the driving chip 11 further includes a plurality of output leads 113. The output leads 113 are disposed at sides of the first input leads 1111 and the second input leads 1121, opposite to each other. The output leads 113 are located at the middle of a side of the driving chip 11.

Please refer to FIG. 7, the driving chip 11 further includes a plurality of virtual leads 114. The virtual leads 114, the group of first input leads 111, and the group of second input leads 112 are disposed side by side. The virtual leads 114 are located between the group of first input leads 111 and the group of second input leads 112.

Please refer to FIGS. 2, 4, 5, and 6, the driving chip 11 further includes a plurality of virtual leads 114. The virtual leads 114 are disposed at sides of the first input leads 1111 and the second input leads 1121, opposite to each other.

The descriptions of the above embodiments are merely used to understand the technical solutions and the core ideas of the present disclosure. It should be understood that a person of ordinary skill in the art can still make modifications corresponding to the technical solutions described in the above embodiments, or replace a part of technical features thereof equivalently. These modifications and replacement cannot cause the essence of corresponding technical solutions to escape from the scope of the technical solutions described in the embodiments of the present disclosure.

What is claimed is:

1. A display panel, comprising:
   a display area;
   a non-display area located at the outside of the display area;
   a driving chip disposed in the non-display area; and
   a plurality of first bonding pads and a plurality of second bonding pads disposed at two opposite sides out of the driving chip and disposed in the non-display area;
   wherein the driving chip comprises a plurality of input leads comprising a group of first input leads and a group of second input leads, wherein the group of first input leads is disposed near and side by side with the plurality of first bonding pads, wherein the group of second input leads is disposed near and side by side with the plurality of second bonding pads, and wherein there is an interval between the group of first input leads and the group of second input leads.

2. The display panel of claim 1, wherein each of the group of first input leads is electrically connected to each of the plurality of first bonding pads through conducting wires, and wherein each of the group of second input leads is electrically connected to each of the plurality of second bonding pads through the conducting wires.

3. The display panel of claim 1, wherein the group of first input leads and the group of second input leads are disposed side by side at the same side of the driving chip.

4. The display panel of claim 3, wherein the driving chip further comprises a plurality of output leads.

5. The display panel of claim 4, wherein the plurality of output leads are disposed at sides of the group of first input leads and the group of second input leads, opposite to each other.

6. The display panel of claim 4, wherein the driving chip further comprises a plurality of virtual leads.

7. The display panel of claim 6, wherein the plurality of output leads, the group of first input leads, and the group of second input leads are disposed side by side at a side of the driving chip, away from the display area.

8. The display panel of claim 7, wherein the plurality of output leads are located between the group of first input leads and the group of second input leads, and wherein the plurality of virtual leads are located at a side of the driving chip, near the display area.

9. The display panel of claim 8, wherein the plurality of first bonding pads, near the group of first input leads, are electrically connected to the group of first input leads, near the plurality of first bonding pads, through first conducting wires, wherein the plurality of first bonding pads, away from the group of first input leads, are electrically connected to the group of first input leads, away from the plurality of first bonding pads, through second conducting wires.

10. The display panel of claim 7, wherein the plurality of output leads, the group of first input leads, and the group of second input leads are disposed side by side at a side of the driving chip, near the display area, wherein the plurality of output leads are located between the group of first input leads and the group of second input leads, and wherein the plurality of virtual leads are located at a side of the driving chip, away from the display area.

11. The display panel of claim 10, wherein the plurality of first bonding pads, near the group of first input leads, are electrically connected to the group of first input leads, away from the plurality of first bonding pads, through first conducting wires, and wherein the plurality of first bonding pads, away from the group of first input leads, are electrically connected to the group of first input leads, near the plurality of first bonding pads, through second conducting wires.

12. The display panel of claim 7, wherein the plurality of output leads are located at a side of the driving chip, near the display area, wherein the plurality of virtual leads, the group of first input leads, and the group of second input leads are disposed side by side at a side of the driving chip, away from the display area, and wherein the plurality of virtual leads are located between the group of first input leads and the group of second input leads.

13. The display panel of claim 2, wherein heights of a part of the plurality of first bonding pads and heights of a part of the plurality of second bonding pads increase gradually from a side near the driving chip to a side away from the driving chip.

14. The display panel of claim 13, wherein a first bonding pad group is composed of the part of the plurality of first bonding pads, wherein a third bonding pad group is composed of the part of the plurality of second bonding pads, wherein the plurality of first bonding pads of the first bonding pad group are arranged continuously or discontinuously, and wherein the plurality of second bonding pads of the third bonding pad group are arranged continuously or discontinuously.

15. A driving chip, comprising a plurality of input leads comprising a group of first input leads and a group of second input leads, wherein the group of first input leads and the group of second input leads are disposed at an interval;
wherein the group of first input leads connects a plurality of first bonding pads out of the driving chip, and wherein the group of first input leads is disposed near and side by side with the plurality of first bonding pads; and
wherein the group of second input leads connects a plurality second bonding pads out of the driving chip, and wherein the group of second input leads is disposed near and side by side with the plurality of second bonding pads.

16. The driving chip of claim 15, wherein the group of first input leads and the group of second input leads are disposed side by side at the same side of the driving chip.

17. The driving chip of claim 16, further comprising a plurality of output leads, wherein the plurality of output leads are disposed at sides of the first input leads and the second input leads, opposite to each other.

18. The driving chip of claim 16, further comprising a plurality of virtual leads, wherein the plurality of virtual leads, the group of first input leads, and the group of second input leads are disposed side by side.

19. The driving chip of claim 18, wherein the plurality of virtual leads are located between the group of first input leads and the group of second input leads.

20. The driving chip of claim 16, further comprising a plurality of virtual leads, wherein the plurality of virtual leads are disposed at sides of the group of first input leads and the group of second input leads, opposite to each other.

* * * * *